United States Patent
Saw et al.

(10) Patent No.: US 11,569,196 B2
(45) Date of Patent: Jan. 31, 2023

(54) CHIP TO CHIP INTERCONNECT IN ENCAPSULANT OF MOLDED SEMICONDUCTOR PACKAGE

(71) Applicant: Infineon Technologies AG, Neubiberg (DE)

(72) Inventors: Khay Chwan Saw, Melaka (MY); Chau Fatt Chiang, Melaka (MY); Stefan Macheiner, Kissing (DE); Wae Chet Yong, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/412,787

(22) Filed: Aug. 26, 2021

(65) Prior Publication Data
US 2021/0391298 A1    Dec. 16, 2021

Related U.S. Application Data

(62) Division of application No. 16/375,479, filed on Apr. 4, 2019, now Pat. No. 11,133,281.

(51) Int. Cl.
*H01L 23/00* (2006.01)
*H01L 23/31* (2006.01)
(Continued)

(52) U.S. Cl.
CPC .......... *H01L 24/82* (2013.01); *H01L 21/4821* (2013.01); *H01L 21/565* (2013.01);
(Continued)

(58) Field of Classification Search
CPC ..... H01L 23/49575; H01L 2224/24137; H01L 2224/82103; H01L 2021/60292
See application file for complete search history.

(56) References Cited

U.S. PATENT DOCUMENTS

| 5,437,915 A | 8/1995 | Nishimura et al. |
| 5,554,886 A | 9/1996 | Song |

(Continued)

FOREIGN PATENT DOCUMENTS

| CN | 101930958 A | 12/2010 |
| DE | 102008039388 A1 | 4/2009 |

(Continued)

OTHER PUBLICATIONS

Unknown, Author , "Dual Exposed Pad PKG", Amkor Technology, 2010, 1-4.

(Continued)

*Primary Examiner* — Daniel Luke
(74) *Attorney, Agent, or Firm* — Murphy, Bilak & Homiller, PLLC

(57) ABSTRACT

A packaged semiconductor includes an electrically insulating encapsulant body having an upper surface, a first semiconductor die encapsulated within the encapsulant body, the first semiconductor die having a main surface with a first conductive pad that faces the upper surface of the encapsulant body, a second semiconductor die encapsulated within the encapsulant body and disposed laterally side by side with the first semiconductor die, the second semiconductor die having a main surface with a second conductive pad that faces the upper surface of the encapsulant body, and a first conductive track that is formed in the upper surface of the encapsulant body and electrically connects the first conductive pad to the second conductive pad. The encapsulant body includes a laser activatable mold compound.

12 Claims, 7 Drawing Sheets

(51) Int. Cl.
*H01L 23/29* (2006.01)
*H01L 25/065* (2006.01)
*H01L 23/495* (2006.01)
*H01L 21/56* (2006.01)
*H01L 21/48* (2006.01)
*H01L 21/60* (2006.01)

(52) U.S. Cl.
CPC ........ *H01L 23/293* (2013.01); *H01L 23/3121* (2013.01); *H01L 23/3135* (2013.01); *H01L 23/49503* (2013.01); *H01L 23/49575* (2013.01); *H01L 24/24* (2013.01); *H01L 25/0655* (2013.01); *H01L 2021/60292* (2013.01); *H01L 2224/11318* (2013.01); *H01L 2224/13083* (2013.01); *H01L 2224/24101* (2013.01); *H01L 2224/24137* (2013.01); *H01L 2224/82009* (2013.01); *H01L 2224/82103* (2013.01); *H01L 2924/186* (2013.01)

(56) References Cited

U.S. PATENT DOCUMENTS

| | | |
|---|---|---|
| 5,602,420 A | 2/1997 | Ogata et al. |
| 5,656,856 A | 8/1997 | Kweon |
| 5,729,433 A | 3/1998 | Mok |
| 5,835,988 A | 11/1998 | Ishii |
| 6,169,323 B1 | 1/2001 | Sakamoto |
| 6,424,031 B1 | 7/2002 | Glenn |
| 6,479,322 B2 | 11/2002 | Kawata et al. |
| 6,534,876 B1 | 3/2003 | Glenn |
| 7,633,765 B1 | 12/2009 | Scanlan et al. |
| 7,944,034 B2 | 5/2011 | Gerber et al. |
| 8,026,589 B1 | 9/2011 | Kim et al. |
| 8,759,956 B2 | 6/2014 | Soller |
| 9,224,688 B2 | 12/2015 | Chuang et al. |
| 9,230,883 B1 | 1/2016 | Hiner et al. |
| 9,559,064 B2 | 1/2017 | Chen et al. |
| 9,564,409 B2 | 2/2017 | Seddon et al. |
| 10,217,728 B2 | 2/2019 | Appelt et al. |
| 10,264,664 B1 | 4/2019 | Vinciarelli et al. |
| 10,424,525 B2 | 9/2019 | Ziglioli |
| 2004/0061213 A1 | 4/2004 | Karnezos |
| 2004/0227251 A1 | 11/2004 | Yamaguchi |
| 2005/0067680 A1 | 3/2005 | Boon et al. |
| 2005/0167814 A1 | 8/2005 | Beroz et al. |
| 2007/0080437 A1 | 4/2007 | Marimuthu et al. |
| 2007/0257340 A1 | 11/2007 | Briggs et al. |
| 2008/0272464 A1 | 11/2008 | Do et al. |
| 2008/0272477 A1 | 11/2008 | Do et al. |
| 2009/0206458 A1 | 8/2009 | Andrews et al. |
| 2009/0230487 A1 | 9/2009 | Saitoh et al. |
| 2009/0321956 A1 | 12/2009 | Sasaki et al. |
| 2010/0044808 A1 | 2/2010 | Dekker et al. |
| 2010/0096737 A1 | 4/2010 | Chua |
| 2010/0207257 A1 | 8/2010 | Lee |
| 2011/0095417 A1 | 4/2011 | Tangpuz et al. |
| 2011/0221005 A1 | 9/2011 | Luo et al. |
| 2012/0108013 A1 | 5/2012 | Fujisawa et al. |
| 2012/0217643 A1 | 8/2012 | Pagaila et al. |
| 2012/0217644 A1 | 8/2012 | Pagaila |
| 2013/0050227 A1 | 2/2013 | Petersen et al. |
| 2013/0280826 A1 | 10/2013 | Scanlan et al. |
| 2013/0307143 A1 | 11/2013 | Lin et al. |
| 2014/0332942 A1 | 11/2014 | Kanemoto |
| 2015/0187608 A1 | 7/2015 | Ganesan et al. |
| 2015/0279778 A1 | 10/2015 | Camacho et al. |
| 2015/0380384 A1 | 12/2015 | Williams et al. |
| 2016/0005675 A1 | 1/2016 | Tong |
| 2016/0155728 A1 | 6/2016 | Zhao et al. |
| 2017/0092567 A1 | 3/2017 | Vincent et al. |
| 2017/0125355 A1 | 5/2017 | Su et al. |
| 2017/0256472 A1 | 9/2017 | Chan et al. |
| 2017/0256509 A1 | 9/2017 | Lee et al. |
| 2017/0317015 A1 | 11/2017 | Lee et al. |
| 2018/0124922 A1 | 5/2018 | Ji et al. |
| 2018/0211946 A1 | 7/2018 | Shiu |
| 2018/0342434 A1 | 11/2018 | Ziglioli |
| 2018/0358292 A1 | 12/2018 | Kong et al. |
| 2019/0115287 A1 | 4/2019 | Derai et al. |
| 2019/0157173 A1 | 5/2019 | Danny Koh et al. |
| 2019/0259629 A1 | 8/2019 | Ziglioli |
| 2020/0185293 A1 | 6/2020 | Schmalzl et al. |
| 2020/0203264 A1 | 6/2020 | Ziglioli |
| 2020/0321276 A1 | 10/2020 | Saw et al. |

FOREIGN PATENT DOCUMENTS

| | | | |
|---|---|---|---|
| DE | 102009015722 A1 | 10/2009 | |
| DE | 102016103790 A1 | 9/2017 | |
| EP | 1775767 A2 | 4/2007 | |
| KR | 20120056624 A | 6/2012 | |
| WO | 2010080068 A1 | 7/2010 | |
| WO | WO-2017045423 A1 * | 3/2017 | ............ H01L 21/56 |
| WO | WO-2017054470 A1 * | 4/2017 | ............ H01L 21/56 |

OTHER PUBLICATIONS

Unknown, Author, "EpoxyClay Steel", Pioneer Adhesives, Inc., Accessed online at http://www.pioneer-adhesives.com/product/epoxyclay-steel on Dec. 11, 2018, 1-2.

Unknown, Author, "Laser-Direct-Structuring (LDS) of 3D-MIDs", LPKF Laser & Electronics AG, https://www.youtube.com/watch?v=VLL9NEA-9PI, Jun. 14, 2010.

Unknown, Author, "MicroLeadFrame® (MLF | QFN | VQFN | LFCSP | DFN | LPCC)", Amkor Technology, https://www.amkor.com/go/qfn, accessed Aug. 10, 2017, 1-3.

Unknown, Author, "Polymer Clay FAQ", Polymer Clay Web, 2011, Accessed online at http://www.polymerclayweb.com/faq.aspx on Dec. 7, 2018, 1-5.

Unknown, Author, "SO8-FL (Flat Lead) Power Discrete", Amkor Technology, https://www.amkor.com/go/packaging/allpackages/so8/so8flflatleadpowerdiscrete, accessed Aug. 10, 2017, 1-2.

Unknown, Author, "This is Mouldable Glue", Sugru, Accessed online at https://sugru.com/abouton Dec. 7, 2018, 1-9.

Unknown, Author, "TSON8-FL (Flat Lead) Power Discrete", Amkor Technology, https://www.amkor.com/go/packaging/all-packages/tson8/tson8-fl-flat-lead-power-discrete, accessed Nov. 16, 2017, 1-2.

* cited by examiner

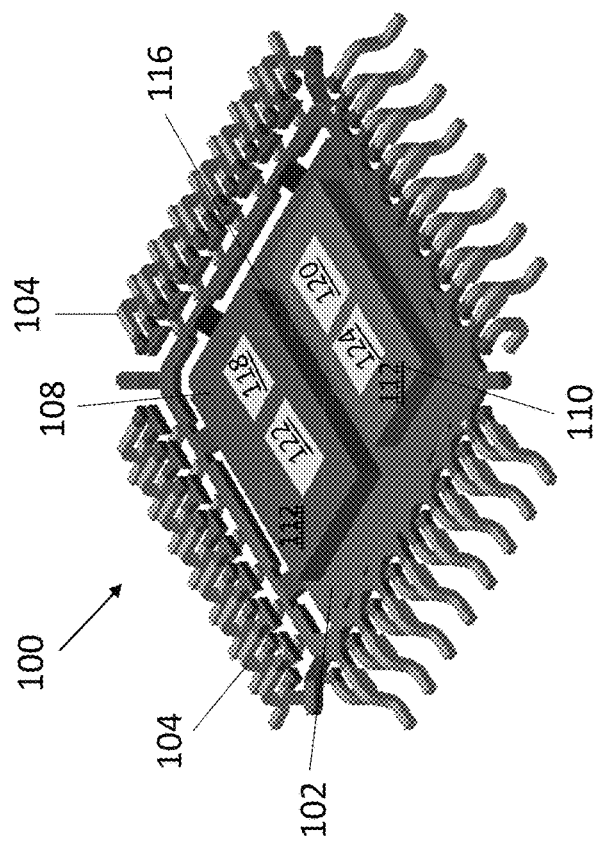
Fig. 1B
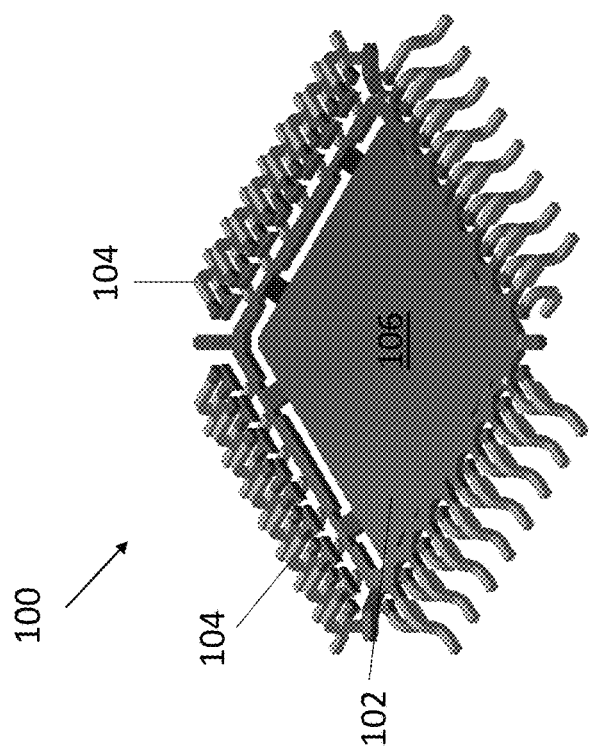
Fig. 1A
FIGURE 1

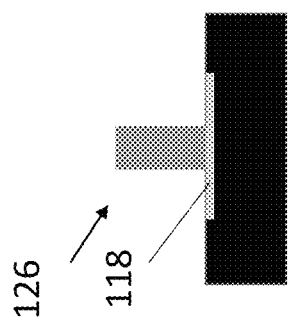
Fig. 3B
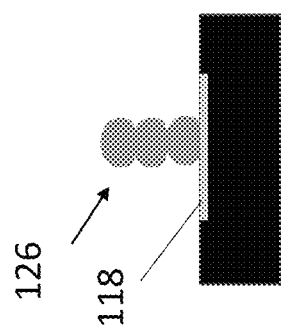
Fig. 3A
FIGURE 3

CHIP TO CHIP INTERCONNECT IN ENCAPSULANT OF MOLDED SEMICONDUCTOR PACKAGE

RELATED APPLICATIONS

This application is a divisional of and claims priority to U.S. application Ser. No. 16/375,479 filed Apr. 4, 2019, the content of which is incorporated by reference in its entirety.

TECHNICAL FIELD

Embodiments of this invention relate to a semiconductor package and the methods thereof.

BACKGROUND

A prevalent trend in semiconductor applications is to reduce the size of a particular semiconductor device and/or increase the functional capability of a particular semiconductor device without increasing its size. This scaling trend results in semiconductor dies with densely arranged bond pads. These semiconductor dies create design challenges with respect to device packaging. In particular, packaging solutions that provide unique electrical connections for each terminal of a semiconductor die with densely arranged bond pads create challenges. Conventional packaging interconnect structures, such as bond wires, clips, ribbons, etc., may be ineffective and/or performance limiting for these electrical connections.

SUMMARY

A packaged semiconductor device is disclosed. According to an embodiment, the packaged semiconductor device includes an electrically insulating encapsulant body having an upper surface, a first semiconductor die encapsulated within the encapsulant body, the first semiconductor die having a main surface with a first conductive pad that faces the upper surface of the encapsulant body, a second semiconductor die encapsulated within the encapsulant body and disposed laterally side by side with the first semiconductor die, the second semiconductor die having a main surface with a second conductive pad that faces the upper surface of the encapsulant body, and a first conductive track that is formed in the upper surface of the encapsulant body and electrically connects the first conductive pad to the second conductive pad. The encapsulant body includes a laser activatable mold compound.

Separately or in combination, a first vertical interconnect structure is disposed on the first conductive pad, and a second vertical interconnect structure that is disposed on the second conductive pad, the first and second conductive pads are covered by material of the encapsulant body, and the first and second vertical interconnect structures each comprise outer ends that are exposed from the encapsulant body at the upper surface Separately or in combination, the first conductive track directly connects with the outer ends of the first and second vertical interconnect structures.

Separately or in combination, the first vertical interconnect structure is a wire stud bump that is attached to the first conductive pad.

Separately or in combination, the second vertical interconnect structure is a metal pillar that is attached to the second conductive pad.

Separately or in combination, a second conductive track is formed in the upper surface of the encapsulant body, and the second conductive track is formed in a second laser activated region of the laser activatable mold compound.

Separately or in combination, the main surface of the first semiconductor die comprises a third conductive pad, the main surface of the second semiconductor die comprises a fourth conductive pad, and the second conductive track electrically connects the third conductive pad to the fourth conductive pad.

Separately or in combination, the first conductive track comprises an elongated span that extends in a first direction, the second conductive track comprises an elongated span that extends in a second direction, and the first and second directions are angled relative to one another.

Separately or in combination, a protective layer that covers the first conductive track, and the protective layer comprises an electrically insulating material different from the laser activatable mold compound.

Separately or in combination, the packaged semiconductor device further comprises a die paddle and a plurality of electrically conductive leads extending away from the die paddle, the first and second semiconductor dies are mounted on laterally adjacent regions of the die paddle, and the upper surface of the encapsulant body is opposite from the die paddle.

Separately or in combination, the first and second semiconductor dies are laterally separated from one another by a gap, a first portion of the encapsulant body fills the gap, and the first conductive track is formed on the first portion of the encapsulant body.

A method of forming a packaged semiconductor device is disclosed. According to an embodiment of the method, a first semiconductor die that comprises a main surface with a first conductive pad is provided, a second semiconductor die that comprises a main surface with a second conductive pad is provided, the first and second semiconductor dies are encapsulated such that the second semiconductor die is disposed laterally side by side with the first semiconductor die and such that the main surfaces of the first and second semiconductor dies each face an upper surface of the encapsulant body, and a first conductive track in the upper surface of the encapsulant body that electrically connects the first conductive pad to the second conductive pad is formed. The encapsulant body includes a laser activatable mold compound. The first conductive track is formed in a first laser activated region of the laser activatable mold compound.

Separately or in combination, forming the first conductive track comprises directing a laser on the laser activatable mold compound thereby forming the first laser activated region, and performing a plating process that forms conductive material in the first laser activated region.

Separately or in combination, the plating process is an electroless liquid plating process.

Separately or in combination, the method further includes providing a first vertical interconnect structure on the first conductive pad before the encapsulating, providing a second vertical interconnect structure on the second conductive pad before the encapsulating, the encapsulating covers the first and second conductive pads with material of the encapsulant body, and after the encapsulating, outer ends of the first and second vertical interconnect structures are exposed at the upper surface of the encapsulant body.

Separately or in combination, the encapsulating of the first and second semiconductor dies comprises completely covering the first vertical interconnect structures with material of the encapsulant body, and the method further comprises performing a thinning process after the encapsulating, and the thinning process removes material from the upper surface of the encapsulant body until the outer ends of the first and second vertical interconnect structures are exposed from the encapsulant body Separately or in combination, encapsulating the first and second semiconductor dies comprises an injection molding process, and the injection molding process comprises using an injection cavity that is dimensioned to cover the main surfaces of the first and second semiconductor chips with liquified molding material while exposing the outer ends of the first and second vertical interconnect structures from the liquified molding material.

Separately or in combination, the first conductive track is formed to directly connect with the outer ends of the first and second vertical interconnect structures.

Separately or in combination, the method further includes forming a protective layer that covers the first conductive track, and the protective layer comprises an electrically insulating material different from the laser activatable mold compound.

Separately or in combination, the method further includes providing a die paddle with a plurality of electrically conductive leads extending away from the die paddle, attaching a lower surface of the first semiconductor die that is opposite from the main surface of the first semiconductor die to a first lateral region of the die paddle, attaching a lower surface of the second semiconductor die that is opposite from the main surface of the second semiconductor die to a second lateral region of the die paddle that is laterally adjacent to the first lateral region, and the upper surface of the encapsulant body is opposite from the die paddle.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates initial steps in a method of forming a packaged semiconductor device. FIG. 1A illustrates providing a carrier, and FIG. 1B illustrates mounting first and second semiconductor dies on a die attach surface of the carrier.

FIG. 3, which includes FIGS. 3A and 3B, illustrates various embodiments of a raised conductive conductor that can be provided on the conductive bond pads. FIG. 3A illustrates a wire stud bump configuration, and FIG. 3B illustrates a metal pillar configuration.

DETAILED DESCRIPTION

Figure 2:
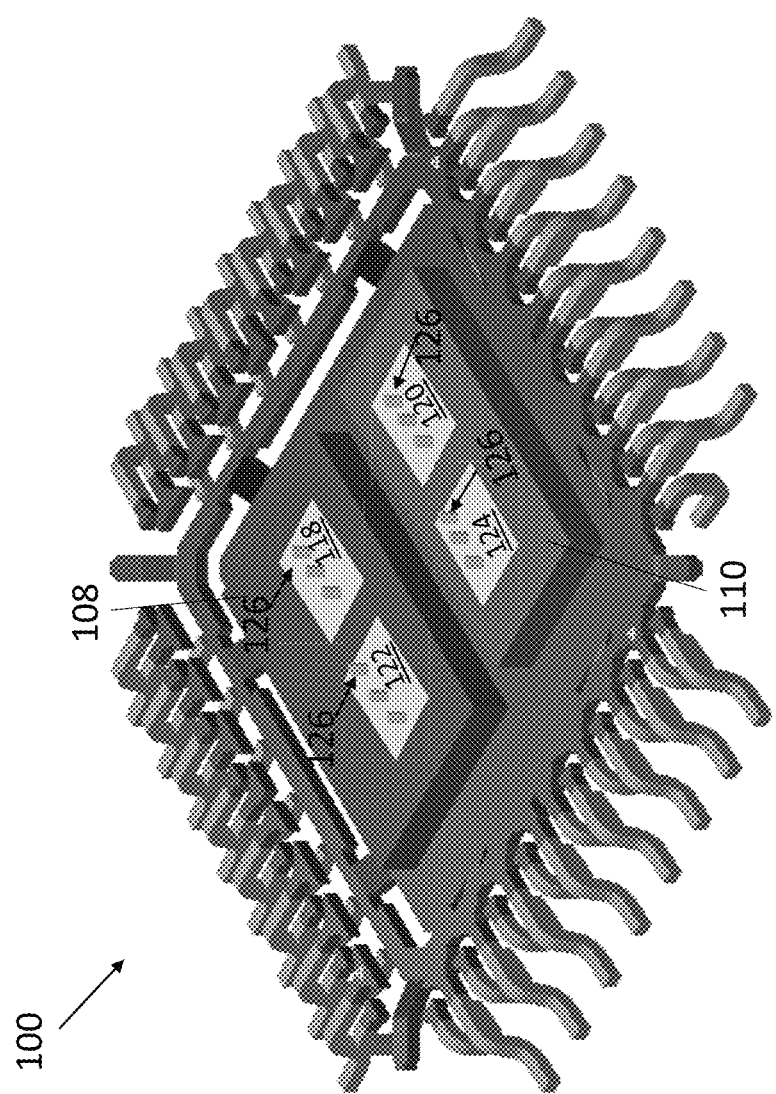
FIG. 2 illustrates providing vertical interconnect structures on conductive bond pads of the first and second semiconductor dies.

The embodiments described herein provide a semiconductor package with a wiring layer formed in a top side of the encapsulant body. In an embodiment, the top side wiring layer is used to electrically connect two or more encapsulated semiconductor dies together. The top side wiring layer can be provided by conductive tracks that are formed by laser patterning technique. According to this technique, the encapsulant body includes a laser-activatable mold compound. A laser beam is applied to the laser-activatable mold compound, thereby forming laser-activated regions along defined tracks. These laser-activated regions provide a seed for a subsequent plating process that forms conductive tracks on the encapsulant body. These conductive tracks can be used in combination with raised conductive connections, e.g., bumps, pillars etc., to provide complete electrical connections between the bond pads of encapsulated semiconductor dies. Additionally, due to the high resolution and geometric flexibility of the laser patterning technique, the top side wiring layer described herein offers high density interconnect capability that can be combined with existing interconnect techniques to meet the interconnect requirements of modern semiconductor devices. Additionally, the conductive tracks can advantageously be used to provide logical interconnect between two dies of lower current/voltage signals, whereas high current/voltage signals, e.g., power signal, can be distributed by thicker leads of the packaged device.

Referring to FIG. 1, a carrier structure 100 is depicted, according to an embodiment. In this embodiment, the carrier structure 100 is provided by a lead frame, wherein the lead frame includes a centrally located die paddle 102 and a plurality (i.e., two or more) of electrically conductive leads 104 that extend away from the die paddle 102. The die paddle 102 includes a planar die attach surface 106 that accommodates the mounting of one or more semiconductor dies thereon. According to an embodiment, the die paddle 102 is integrally connected with some of the leads 104 and thus provides a connection point for a terminal of a semiconductor die. Generally speaking, the carrier structure 100 can include conductive metals, such as copper, aluminum, etc., and alloys thereof.

Referring to FIG. 1A, first and second semiconductor dies 108, 110 are provided on the carrier structure 100. Generally speaking, the first and second semiconductor dies 108, 110 can have a wide variety of device configurations. These device configurations include discrete device configurations, such as HEMT (high electron mobility transistor) devices, diodes, thyristors, etc. These device configurations also include integrated device configurations, such as controllers, amplifiers, etc. These device configurations can include vertical devices, i.e., devices which conduct in a direction perpendicular to the main and rear surfaces of the die, and lateral devices, i.e., devices which conduct in a direction parallel to the main surface of the die.

The first and second semiconductor dies 108, 110 each have a main surface 112, a rear surface 114 (See FIG. 7) that is opposite from the main surface 112, and outer edge sides 116 extending between the main and rear surfaces 112, 114. The main surface 112 of the first semiconductor die 108 includes a first electrically conductive bond pad 118. The main surface 112 of the second semiconductor die 110 includes a second electrically conductive bond pad 120. In the depicted embodiment, the main surface 112 of the first semiconductor die 108 additionally includes a third electrically conductive bond pad 122, and the main surface 112 of the second semiconductor die 110 additionally includes a fourth electrically conductive bond pad 124. These bond pads provide terminal connections (e.g., gate, source, emitter, collector, logical terminals, etc.) for the devices incorporated into the first and second semiconductor dies 108, 110. More generally, the number, size and configuration of bond pads may vary. Optionally, the rear surfaces 114 of the first and/or second semiconductor die 108, 110 may include similarly configured bond pads that provide terminal connections for the respective device.

The second semiconductor die 110 is arranged laterally side by side with the first semiconductor die 108. This means that the outer edge side 116 of the second semiconductor die 110 faces the outer edge side 116 of the first semiconductor die 108. Hence, the first and second semiconductor dies 108, 110 are next to one another in a lateral direction. The lateral direction refers to a direction that is parallel to the main and rear surfaces 112, 114 of the semiconductor dies 108, 110. As shown, the first and second semiconductor dies 108, 110 are laterally separated from one another by a gap. In other configurations, the first and second semiconductor dies 108, 110 can be flush or close to flush against one another.

The first and second semiconductor dies 108, 110 are mounted on laterally adjacent regions of the die attach surface 106. In this configuration, the rear surface 114 of the first semiconductor die 108 faces and is directly attached to a first region of the die attach surface 106, and the rear surface 114 of the second semiconductor die 110 faces and is directly attached to a second region of the die attach surface 106 that is laterally spaced apart from the first region. The rear surfaces 114 of each semiconductor die 108, 110 can be directly attached to the carrier by an adhesive, e.g., solder, conductive glue, etc.

Referring to FIG. 2, vertical interconnect structures 126 are provided on the conductive pads of the first and second semiconductor dies 108, 110. These vertical interconnect structures 126 vertically extend above the main surfaces 112 of the first and second semiconductor dies 108, 110, and thus represent an uppermost contact surface for the mounted semiconductor dies 108, 110. Various examples of these vertical interconnect structure are shown in more detail in FIG. 3. The vertical interconnect structures 126 can be attached to the bond pads after mounting the semiconductor dies 108, 110 on the die paddle 102. Alternatively, the vertical interconnect structures 126 can be provided on the bond pads before mounting the semiconductor dies 108, 110 on the die paddle 102. Before the encapsulation step to be described below, electrical connections (not shown) between the leads 104 and both semiconductor dies 108, 110 can be provided using known techniques, such as wire bonding Referring to FIG. 3A, the vertical interconnect structure 126 can be configured as a wire stud bump. These wire stud bumps are made from an electrically conductive material, e.g., copper, gold, aluminium, nickel, etc., and alloys thereof. These structures are formed by depositing small drops of liquified metal on the bond pads. As shown, the vertical interconnect structures 126 include a number of bumps (balls) deposited successively on top of another.

Referring to FIG. 3B, the vertical interconnect structure 126 can be configured as a metal pillar. These metal pillars are made from an electrically conductive metal, e.g., copper, gold, aluminium, nickel, etc., and alloys thereof.

More generally, the vertical interconnect structures 126 can be provided by any conductive structure which can be attached to bond pads to provide a vertical extension past the main surface 112 of the semiconductor die.

Referring again to FIG. 2, the vertical interconnect structures 126 provided on the bond pads 118, 122 of the first semiconductor die 108 can have any of the above described configurations. Likewise, the vertical interconnect structures 126 provided on the bond pads 120, 124 of the second semiconductor die 120 can have any of the above described configurations and may have a configuration different from those of the first semiconductor die 108.

Figure 4:
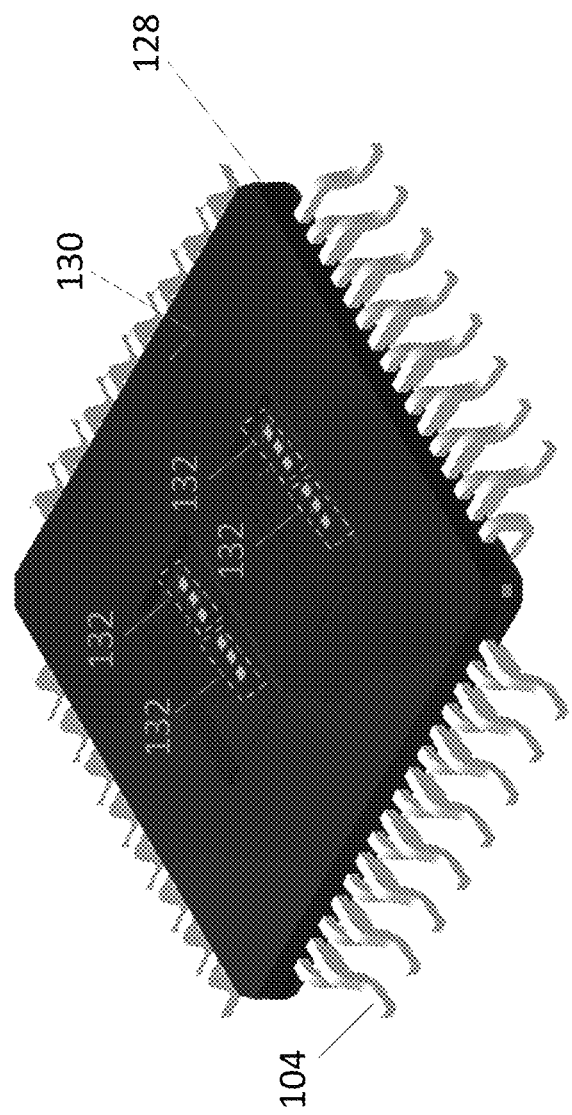
FIG. 4 illustrates forming an encapsulant body that encapsulates the semiconductor dies and exposes outer ends of the vertical interconnect structures at an upper surface.

Referring to FIG. 4, an electrically insulating encapsulant body 128 is formed. The encapsulant body 128 is an electrically insulating structure that seals and protects the semiconductor dies and associated electrical connections, e.g., wire bonds (not shown) between the semiconductor dies 108, 110 and the leads 104. For example, the encapsulant body 128 can include a wide variety of electrically insulating materials such as ceramics, epoxy materials and thermosetting plastics, to name a few. At least a portion of the electrically insulating encapsulant body 128 includes a laser-activatable mold compound. As used herein, a "laser-activatable mold compound" refers to a mold compound that includes at least one additive, e.g., in the form of an organic metal complex which is activated by a physio-chemical reaction induced by a focused laser beam. In addition to the additive, a "laser-activatable mold compound" includes a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

The encapsulant body 128 can be formed using any of a variety of known techniques, such as injection molding, transfer molding, compression molding, etc. The material of the encapsulant body 128 is formed to completely encapsulate, i.e., cover and surround, the semiconductor dies 108, 110 and associated electrical connections between the semiconductor dies 108, 110 and leads 104. In the case that the semiconductor dies 108, 110 are separated from one another by a lateral gap (e.g., as shown in FIG. 2) the encapsulant body 128 can be formed to completely fill this gap.

The encapsulant body 128 includes an upper surface 130. The encapsulant body 128 is formed such that the main surfaces 112 of the first and second semiconductor dies 108, 110 are completely covered by encapsulant material. Put another way, a thickness of encapsulant material is provided between the main surfaces 112 of the first and second semiconductor dies 108, 110 and the upper surface 130 of the encapsulant body 128. Hence, the main surfaces 112 of the first and second semiconductor dies 108, 110 (not shown in FIG. 4) face the upper surface 130 of the encapsulant body 128.

The encapsulant body 128 is formed such that outer ends 132 of the vertical interconnect structures 126, are exposed from the encapsulant material at the upper surface 130 of the encapsulant body 128. This means that the conductive material of the vertical interconnect structures 126 is physically accessible at the upper surface 130 of the encapsulant body 128.

One technique for forming the encapsulant body 128 such that the outer ends 132 of the vertical interconnect structures 126 are exposed at the upper surface 130 of the encapsulant body 128 is as follows. In some embodiments, initially, the encapsulant body 128 is formed to completely cover the vertical interconnect structures 126 with encapsulant material. That is, a thickness of the encapsulant body 128 between the main surfaces 112 of the semiconductor dies 108, 110 and the upper surface 130 is selected to be greater than a height of the vertical interconnect structures 126. Subsequently, a thinning process is performed to remove encapsulant material at the upper surface 130 until the outer ends 132 of the vertical interconnect structures 126 are exposed from the encapsulant body 128. This thinning can be done according to known planarization techniques, e.g., polishing, grinding, etching, etc. In another example, the encapsulant material can be removed by a laser. This laser thinning technique can also provide the laser activation process to be described in further detail below.

Another technique for forming the encapsulant body 128 such that the outer ends 132 of the vertical interconnect structures 126 are exposed at the upper surface 130 of the encapsulant body 128 is as follows. The process for forming the encapsulant body 128 is controlled such that the completed encapsulant body 128 exposes the outer ends 132 of the vertical interconnect structures 126. Put another way, a thickness of the encapsulant material between the main surfaces 112 of the semiconductor dies 108, 110 and the upper surface 130 of the encapsulant body 128 is selected to be less than a height of the vertical interconnect structures 126 above the bond pads. In one example of this technique, the encapsulant body 128 is formed by an injection molding process which utilizes an injection cavity that is dimensioned to cover the main surfaces of the first and second semiconductor dies 108, 110 with liquified molding material without covering the outer ends 132 of the vertical interconnect structures 126. After performing this initial injection molding process, further processing steps may be performed. These steps may include cleaning steps, planarization steps to planarize the exposed outer ends 132 of the vertical interconnect structures 126 and/or further molding steps to form additional portions of the encapsulant body 128.

Figure 5:
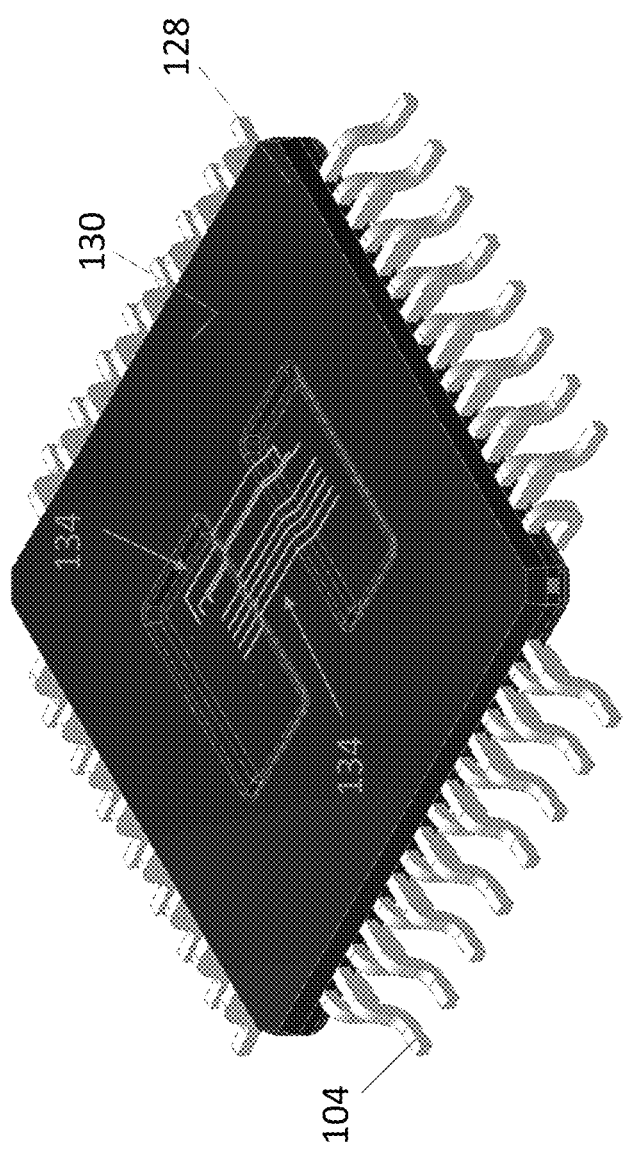
FIG. 5 illustrates performing a laser activation process that forms laser activated regions in the upper surface of the encapsulant body.

Referring to FIG. 5, a laser activation process is performed on the upper surface 130 of the encapsulant body 128. The laser activation process includes directing a laser beam on the laser-activatable mold compound that is present at the upper surface 130 of the encapsulant body 128. The energy from the laser beam creates laser-activated regions 134 in the encapsulant body 128. As used herein, a "laser-activated region" refers to a region of laser-activatable mold compound has reacted with a laser beam such that organic metal complexes are present at the surface of the laser-activatable mold compound and are capable of acting as a nuclei for metal plating process, examples of which will be described in further detail below. By contrast, the portions of the laser-activatable mold compound that are not exposed to a laser beam do not have exposed metal complexes that are capable of acting as a nuclei during a metal plating process.

Figure 6:
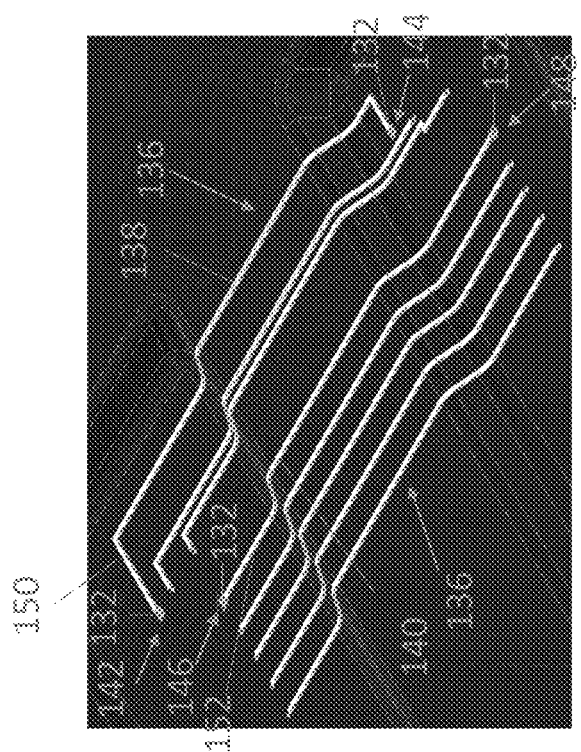
FIG. 6 illustrates performing a plating process that forms conductive tracks in the laser activated regions of the encapsulant body.

Referring to FIG. 6, a plating process is performed on the semiconductor device. The plating process forms conductive material in the laser-activated regions 134 of the mold compound without substantially forming the conductive material in inactivated regions of the laser-activatable mold compound. This means that the vast majority of metal (e.g., greater than 95%, 99% etc.) formed by the plating process forms in the laser-activated regions 134. Moreover, the conductive material formed in the laser-activated regions 134 forms a defined, conductive track that is capable of carrying an electrical current.

Generally speaking, the plating process may be any metal plating process that utilizes a seed metal as a basis for depositing metal thereon. In one example, the plating process is an electroless liquid plating process. According to this technique, the semiconductor device is submerged in a chemical bath that contains metal ions (e.g., Cu+ ions, Ni+ ions, Ag+ ions, etc.) that react with the organic metal complexes in the later activated regions, thereby forming a complete layer of the element from the chemical bath. The plating process may begin with a cleaning step to remove laser debris and may be followed by an additive build-up of plated metal using the chemical bath. Optionally, additional metal coatings e.g., coatings containing Ni, Au, Sn, Sn/Pb, Ag, Ag/Pd, etc., may be applied on the deposited metal after the plating process.

As a result of the laser activation and plating steps described above, a number of conductive tracks 136 are formed in the laser-activated regions 134 of the laser-activatable mold compound. These conductive tracks 136 can be used to provide electrical connections between the terminals of semiconductor dies encapsulated within the encapsulant body 128. As shown, the conductive tracks 136 are formed to extend across the portion of the encapsulant material that fills the gap between the first and second semiconductor dies 108, 110 and thus provide a lateral electrical connection mechanism. More generally, these conductive tracks 136 can be formed in any location of the encapsulant body 128 that includes laser-activatable mold compound.

According to an embodiment, a first one 138 of the conductive tracks 136 electrically connects the first conductive pad 118 of the first semiconductor die 108 (shown in FIG. 2) to the second conductive pad 120 of the second semiconductor die 110 (shown in FIG. 2). In this case, the first one 138 of the conductive tracks 136 forms an electrical connection between a first one 142 of the vertical interconnect structures 126 that is disposed on the first conductive pad 118 and a second one 144 of the vertical interconnect structures 126 that is disposed on the second conductive pad 120. Similarly, a second one 140 of the conductive tracks 136 forms an electrical connection between a third one 146 of the vertical interconnect structures 126 that is disposed on the third conductive pad 122 (shown in FIG. 2) and a fourth one 148 of the vertical interconnect structures 126 that is disposed on the fourth conductive pad 124 (shown in FIG. 2). In the depicted embodiment, these conductive tracks 136 form a complete electrical connection between the exposed outer ends 132 of two vertical interconnect structures 126. Alternatively, other conductive structures (e.g., bond wires, clips, via structures, etc.) can be part of an electrical connection the exposed outer ends 132 of two vertical interconnect structures 126.

More generally, any number of the conductive tracks 136 can be formed in the upper surface 130 of the encapsulant body 128 to provide electrical connections between two or more semiconductor dies encapsulated within the encapsulant body 128. These conductive tracks 136 can provide separate electrical nodes, e.g., in the case of the first and second ones 138, 140 of the conductive tracks 136 as described above, or can be part of a single electrical node, e.g., for increased current carrying capability.

Advantageously, the laser structuring technique described herein allows the conductive tracks 136 to be formed as narrow width and/or tight pitch structures. As the geometry of the conductive tracks 136 is correlated to the width of a laser beam, these structures can be formed at a high degree of resolution. Moreover, the laser technique provides a high degree of flexibility with respect to the geometry of the conductive tracks 136. Put another way, in comparison to conventional metallization techniques, restrictive ground rules are not needed. In an illustration of this capability, the first one 138 of the conductive tracks 136 in the depicted embodiment includes a first elongated span 150 that extends in a first direction, and the second one 140 of the conductive tracks 136 includes a second elongated span 152 that extends in a second direction that is angled relative to the first direction. That is, the first and second elongated spans 150, 152 are oriented non-parallel to one another, e.g., about perpendicular. More generally, the conductive tracks 136 formed by the laser structuring technique can be oriented any of a variety of angles, e.g., oblique, acute, etc relative to one another. Moreover, different conductive tracks 136 can have different widths, lengths, etc. Moreover, as shown, the conductive tracks 136 can be formed to extend along different planes. For example, the conductive tracks 136 shown in FIG. 5 include inclined regions that extend from recessed portions over the semiconductor dies to the portion of the encapsulant material that fills the gap between semiconductor dies. Advantageously, any of these structures can be formed without the use of expensive masks.

Figure 7:
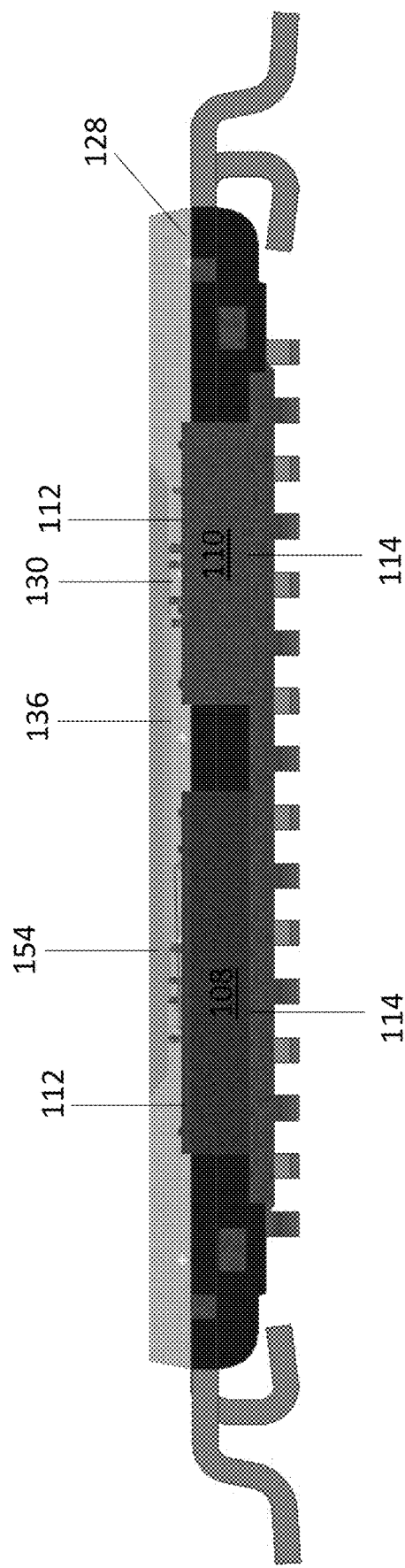
FIG. 7 illustrates forming a protective layer on the conductive tracks formed in the laser activated regions of the encapsulant body.

Referring to FIG. 7, after the conductive tracks 136 are formed in the above described manner, an optional protective layer 154 can be formed to cover some or all of the conductive tracks 136. Among other things, the protective layer 154 can damage to the conductive tracks 136, e.g., from moisture, particles, physical handling of the device, etc. The protective layer 154 can be formed from an electrically insulating material that is different from material of the laser-activatable mold compound. Examples of these materials include epoxy based plastics and diamond based materials, to name a few.

While a particular lead-frame style package is used in the illustrated embodiments, the laser connection techniques described herein are more generally applicable to a wide variety of package types. These package types include flat packages, leaded packages, leadless packages, and surface mount type packages, to name a few. In any of these examples, a laser-activatable mold compound can be used in part or in whole as encapsulant material and structured according to the techniques described herein.

The "upper surface" of the encapsulant body as described herein refers to a surface of the encapsulant body that is disposed above one or more semiconductor dies such that upper surfaces of the covered semiconductor die face the upper surface of the encapsulant body. The "upper surface" of the encapsulant body is not necessarily an outermost exposed surface of the packaged device. For example, as shown in the embodiment of FIG. 7, the upper surface 130 of the encapsulant body is covered by a protective layer. Additionally or alternatively, additional layers of encapsulant material may be formed over at least part of an "upper surface" of an encapsulant body such that the conductive tracks 136 described herein are embedded within encapsulant material.

The term "electrically connected," "directly electrically connected" and the like describes a permanent low-impedance connection between electrically connected elements, for example a direct contact between the relevant elements or a low-impedance connection via a metal and/or a highly doped semiconductor.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A packaged semiconductor device, comprising:
an electrically insulating encapsulant body comprising an upper surface;
a first semiconductor die encapsulated within the encapsulant body, the first semiconductor die comprising a main surface with a first conductive pad that faces the upper surface of the encapsulant body;
a second semiconductor die encapsulated within the encapsulant body and disposed laterally side by side with the first semiconductor die, the second semiconductor die comprising a main surface with a second conductive pad that faces the upper surface of the encapsulant body;
a first conductive track that is formed in the upper surface of the encapsulant body and electrically connects the first conductive pad to the second conductive pad; and
a protective layer disposed over the first conductive track,
wherein the encapsulant body comprises a laser activatable mold compound;
wherein the first conductive track is formed in a first laser activated region of the laser activatable mold compound,
wherein the protective layer comprises an electrically insulating material different from the laser activatable mold compound,
wherein the protective layer contacts and completely covers an upper surface of the first conductive track.

2. The packaged semiconductor device of claim 1, further comprising:
a first vertical interconnect structure that is disposed on the first conductive pad; and
a second vertical interconnect structure that is disposed on the second conductive pad,
wherein the first and second conductive pads are covered by material of the encapsulant body, and
wherein the first and second vertical interconnect structures each comprise outer ends that are exposed from the encapsulant body at the upper surface.

3. The packaged semiconductor device of claim 2, wherein the first conductive track directly connects with the outer ends of the first and second vertical interconnect structures.

4. The packaged semiconductor device of claim 2, wherein the first vertical interconnect structure is a wire stud bump that is attached to the first conductive pad.

5. The packaged semiconductor device of claim 4, wherein the second vertical interconnect structure is a metal pillar that is attached to the first conductive pad.

6. The packaged semiconductor device of claim 1, further comprising a second conductive track formed in the upper surface of the encapsulant body, wherein the second conductive track is formed in a second laser activated region of the laser activatable mold compound.

7. The packaged semiconductor device of claim 6, wherein the main surface of the first semiconductor die comprises a third conductive pad, wherein the main surface of the second semiconductor die comprises a fourth conductive pad, and wherein the second conductive track electrically connects the third conductive pad to the fourth conductive pad.

8. The packaged semiconductor device of claim 7, wherein the first conductive track comprises an elongated span that extends in a first direction, wherein the second conductive track comprises an elongated span that extends in a second direction, and wherein the first and second directions are angled relative to one another.

9. The packaged semiconductor device of claim 1, further comprising a die paddle and a plurality of electrically conductive leads extending away from the die paddle, wherein at least one of the first and second semiconductor dies is mounted on the die paddle, and wherein the upper surface of the encapsulant body is opposite from the die paddle.

10. The packaged semiconductor device of claim 1, wherein the first and second semiconductor dies are laterally separated from one another by a gap, wherein a first portion of the encapsulant body fills the gap, and wherein the first conductive track is formed on the first portion of the encapsulant body.

11. The packaged semiconductor device of claim 1, wherein the main surfaces of the first and second semiconductor dies are each disposed below the upper surface of the encapsulant body.

12. The packaged semiconductor device of claim 1, wherein the protective layer comprises an epoxy based plastic.

* * * * *